United States Patent
Hattori

(10) Patent No.: US 10,535,565 B2
(45) Date of Patent: Jan. 14, 2020

(54) WORKPIECE DIVIDING METHOD

(71) Applicant: DISCO CORPORATION, Tokyo (JP)

(72) Inventor: Nao Hattori, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/053,137

(22) Filed: Aug. 2, 2018

(65) Prior Publication Data

US 2019/0051561 A1    Feb. 14, 2019

(30) Foreign Application Priority Data

Aug. 9, 2017  (JP) .................................. 2017-154235

(51) Int. Cl.
*H01L 21/82* (2006.01)
*H01L 21/67* (2006.01)
*B23K 26/0622* (2014.01)

(52) U.S. Cl.
CPC .......... *H01L 21/82* (2013.01); *B23K 26/0624* (2015.10); *H01L 21/67092* (2013.01); *H01L 2221/68327* (2013.01)

(58) Field of Classification Search
None
See application file for complete search history.

(56) References Cited

U.S. PATENT DOCUMENTS

2015/0159821 A1* 6/2015 Arakawa .............. B23K 26/402
216/24

FOREIGN PATENT DOCUMENTS

JP          2014221483 A     11/2014

* cited by examiner

*Primary Examiner* — Asok K Sarkar
(74) *Attorney, Agent, or Firm* — Greer Burns & Crain Ltd.

(57) ABSTRACT

A workpiece dividing method includes: a laser processing step of forming along each street a plurality of minute holes extending in a pulsed laser beam application direction; and a dividing step of pressing the streets by a pressing member to divide a wafer along the streets. The minute hole has one end opening at least one of a front surface and a back surface of the wafer and is decreased in diameter from the one end toward the other end. In the dividing step, the pressing member is pressed against that surface of the front surface and the back surface of the wafer at which the one end of the minute hole is not opening.

12 Claims, 5 Drawing Sheets

WORKPIECE DIVIDING METHOD

BACKGROUND OF THE INVENTION

Field of the Invention

The present invention relates to a method of dividing a workpiece along streets (division lines) set on the workpiece.

Description of the Related Art

A workpiece such as a wafer has devices such as integrated circuits (ICs) and large scale integrated circuits (LSIs) formed on a front surface thereof in the state of being partitioned by streets. Examples of the method for dividing the workpiece into individual chips include a method in which a focal point of a laser beam of such a wavelength as to be transmitted through the workpiece is positioned in the inside of the workpiece at a position corresponding to the street, the laser beam and the workpiece are put into relative scanning, whereby a plurality of shield tunnels are formed inside the wafer along each street, and thereafter an external force is exerted along each street, to divide the workpiece (see, for example, Japanese Patent Laid-Open No. 2014-221483).

SUMMARY OF THE INVENTION

In the method disclosed in Japanese Patent Laid-Open No. 2014-221483, however, there is a problem that at the time of exerting an external force on the workpiece, the workpiece would be damaged or broken, depending on the surface against which a pressing member is pressed.

It is therefore an object of the present invention to provide a workpiece dividing method by which a workpiece can be divided without being damaged or broken.

In accordance with an aspect of the present invention, there is provided a workpiece dividing method for dividing a workpiece along streets set on the workpiece, the workpiece dividing method including: a laser processing step of applying a pulsed laser beam to the workpiece along the street to form along the street a plurality of minute holes extending in a pulsed laser beam application direction; and a dividing step of pressing the streets by a pressing member to divide the workpiece along the streets, after the laser processing step is conducted, in which the minute hole has one end opening at least at one of a front surface and a back surface of the workpiece and is decreased in diameter from the one end toward the other end, and in the dividing step, the pressing member is pressed against that surface of the front surface and the back surface of the workpiece at which the one end of the minute hole is not opening.

Preferably, the workpiece dividing method further includes a checking step of checking at which one of the front surface and the back surface of the workpiece the one end or the other end of the minute hole is formed, before carrying out the dividing step.

According to the workpiece dividing method of the present invention, in the dividing step, the pressing member is pressed against that surface of the front surface and the back surface of the workpiece at which the one end of the minute hole is not opening; therefore, the minute hole is pushed side open more easily on the diametrically enlarged one end side than on the other end side, so that dividability of the wafer is enhanced, and, accordingly, the wafer can be favorably divided without being damaged or broken.

Where the checking step of checking at which of the front surface and the back surface of the workpiece the one end or the other end of the minute hole is formed is further provided before carrying out the dividing step, it is ensured that proceeding to the dividing step can be made after grasping the one end of the minute hole on which to exert the external force by the pressing member in performing the dividing step, and, accordingly, the workpiece can be divided in a reliable manner.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

1. First Embodiment of Dividing Method

Figure 1:
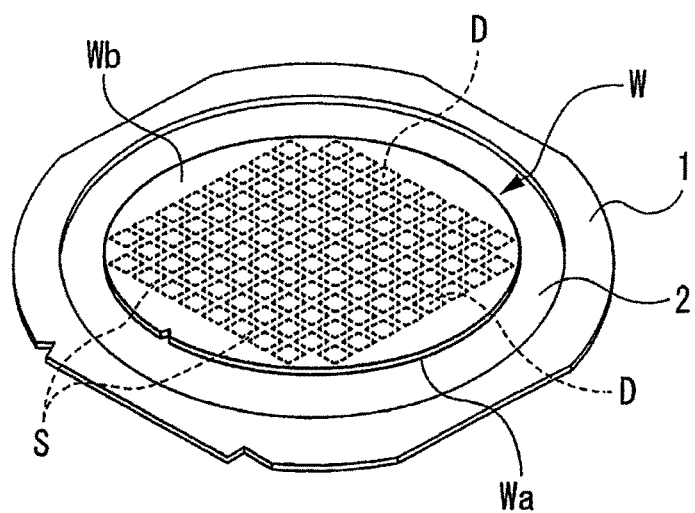
FIG. 1 is a perspective view of a wafer supported on an annular frame through an adhesive tape.

A wafer W depicted in FIG. 1 is an example of a workpiece having a circular disk-shaped substrate, and streets (division lines) S in a grid pattern are set on a front surface Wa thereof. Devices D are formed in respective regions partitioned by the streets S. On the other hand, a surface on the side opposite to the front surface Wa of the wafer W is a back surface Wb on which a laser beam is to be incident. The material of the wafer W is, for example, a glass, LT/LN (lithium tantalate/lithium niobate), SiC (silicon carbide), Si (silicon), crystal, sapphire, a ceramic or the like.

In order to divide the wafer W into chips having individual devices D, an expandable adhesive tape 2 is adhered to a lower surface of an annular frame 1 opening in the center thereof, and the front surface Wa side of the wafer W is adhered to the adhesive tape 2 exposed from the center of the frame 1, with the back surface Wb exposed to the upper side. In this way, the frame 1 and the wafer W are formed integrally, through the adhesive tape 2. The adhesive tape 2 is not particularly limited; for example, an expandable sheet having a two-layer structure in which an adhesive layer is stacked on a base material layer formed of polyolefin or polyvinyl chloride or the like is used. A first embodiment of a dividing method for dividing the wafer W into individual chips will now be described below.

(1) Laser Processing Step

Figure 2:
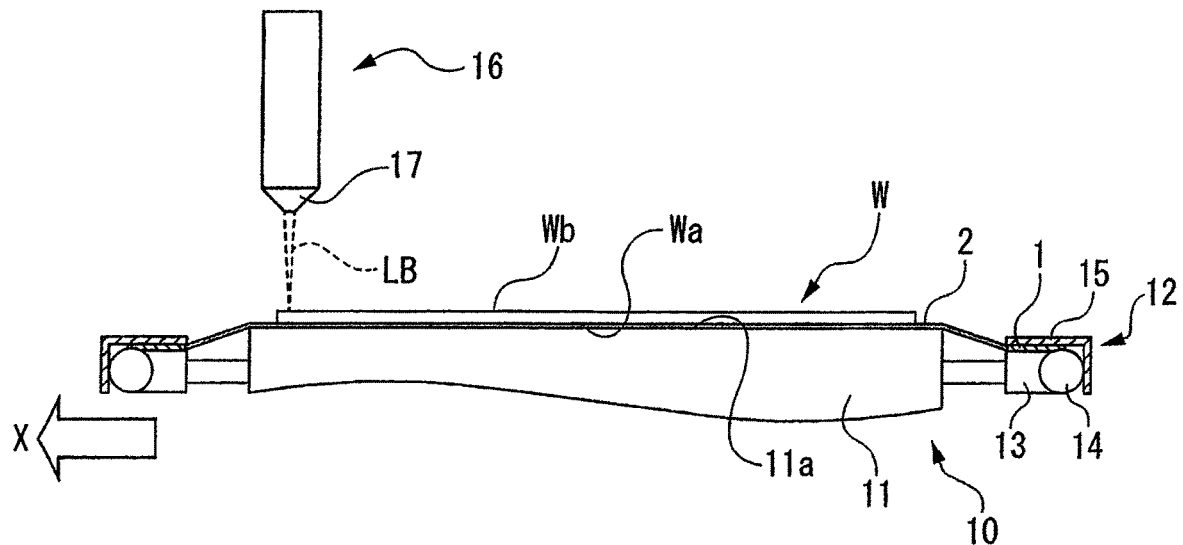
FIG. 2 is a sectional view depicting a first embodiment of a laser processing step.

As depicted in FIG. 2, the wafer W integrated with the frame 1 is held by a holding unit 10 for holding the wafer W, and the wafer W is laser processed along the streets S by a laser beam applying unit 16 disposed on the upper side of the holding unit 10. The holding unit 10 includes a holding table 11 having a holding surface 11a for holding the wafer W, and a frame holding unit 12 disposed at a peripheral edge of the holding table 11.

The frame holding unit 12 includes a frame mount base 13 on which to mount the frame 1, shaft sections 14 connected to the frame mount base 13, and clamp sections 15 that are rotated with the shaft sections 14 as fulcrums and that press an upper surface of the frame 1 mounted on the frame mount base 13. The laser beam applying unit 16 includes at least a condenser 17 incorporating a focusing lens therein for focusing a pulsed laser beam LB of a wavelength for forming minute holes along the streets S, a laser oscillator that oscillates the pulsed laser beam LB, and an output adjustor that adjusts the output of the pulsed laser beam LB oscillated from the laser oscillator. The laser beam applying unit 16 can be moved in the vertical direction, to move the condenser 17 upward and downward, whereby the focusing position of the pulsed laser beam LB can be adjusted. The focusing lens is preferably a focusing lens having spherical aberration, whereby the focal point of the pulsed laser beam LB is positioned in such a manner as to extend in the thickness direction of the wafer W. Note that it is only necessary for the pulsed laser beam LB to be applied to the wafer W in a state in which aberration is generated in an optical axis direction of the focusing lens; thus, aberration may be formed by disposing a lens on the laser oscillator side or the wafer W side of the focusing lens, or the pulsed laser beam LB having a predetermined spread angle may be oscillated from the laser oscillator and be focused by the focusing lens.

At the time of laser processing of the wafer W, the front surface Wa side of the wafer W with the adhesive tape 2 adhered thereto is mounted on the holding surface 11a of the holding table 11, and the frame 1 is placed on the frame mount base 13. The clamp sections 15 are rotated around the shaft sections 14, to press and fix the upper surface of the frame 1. A laser processing step in the first embodiment is carried out, for example, under the following processing conditions 1.

[Processing Conditions 1]
Material of wafer: LT (lithium tantalate)
Wavelength: 1,030 nm
Average output: 3 W
Repetition frequency: 50 kHz
Pulse width: 10 ps
Spot diameter: 10 µm
Processing feed rate: 500 mm/second
(Numerical aperture of focusing lens)/(Refractive index of wafer): 0.05 to 0.20

Figure 3:
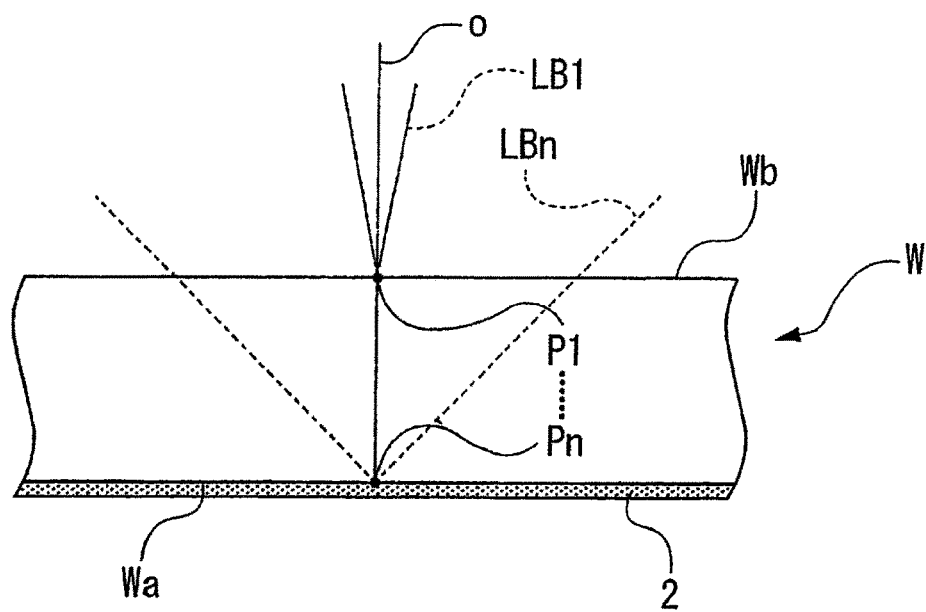
FIG. 3 is a partial enlarged sectional view for explaining a focal point position of a pulsed laser beam in the first embodiment.

The laser beam applying unit 16 lowers the condenser 17 in the direction for approaching the wafer W, and positions the positions of the focal points of the laser beam LB in such a manner as to extend in the thickness direction of the wafer W. For example, as depicted in FIG. 3, the position of a focal point P1 of a pulsed laser beam LB1 passing on the optical axis O located on the innermost side of the condenser 17 is positioned on the back surface Wb side of the wafer W, whereas the position of a focal point Pn of a pulsed laser beam LBn passing on the outermost side of the condenser 17 is positioned on the holding table 11 side (the front surface Wa side of the wafer W). As a result, the focal points of the pulsed laser beam LB passing through the focusing lens of the condenser 17 are positioned in such a manner as to extend ranging from the back surface Wb to the front surface Wa of the wafer W.

For instance, in the case where the thickness of the wafer W is 300 µm, it is preferable to set the positions of the focal points such that the focal points P1 to Pn extend ranging over the thickness from the front surface Wa to the back surface Wb, namely, over the thickness of 300 µm. While the length of the focal points P1 to Pn may not necessarily be set to be greater than the thickness of the wafer W, where the length is set to range over the whole thickness from the front surface Wa to the back surface Wb of the wafer W, better shield tunnels (minute holes and modified regions formed by modification of the surroundings of the minute holes into an amorphous state) can be formed inside the wafer W. Note that while the pulsed laser beam LB is divided into the pulsed laser beams LB1 to LBn and the focal point is divided into the focal points P1 to Pn for explaining the focal point position of the pulsed laser beam LB in the example of FIG. 3, the pulsed laser beams and the focal points are not observed in such a divided state in practice.

Figure 4:
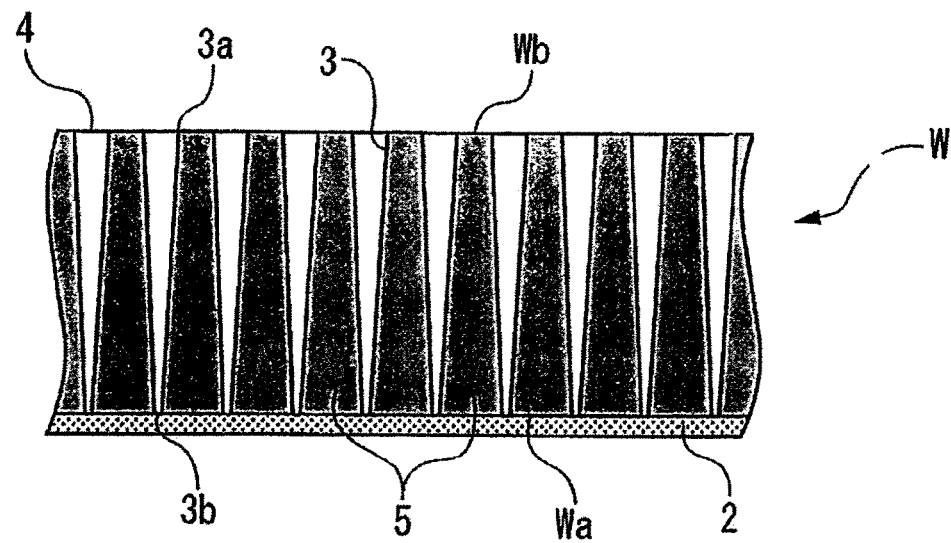
FIG. 4 is a partial enlarged sectional view depicting the state of a wafer after the first embodiment of the laser processing step is conducted.

Next, while conducting processing feeding of the wafer W depicted in FIG. 2 at a predetermined processing feed rate (500 mm/second) and in the direction of arrow X, for example, the laser beam applying unit 16 applies a pulsed laser beam LB of a predetermined wavelength (1,030 nm) along the street S depicted in FIG. 1 from the back surface Wb side of the wafer W, to form a plurality of minute holes 3, that extend in the application direction of the pulsed laser beam LB and are depicted in FIG. 4, along the street S. Each of the minute holes 3 is a minute hole that has one end 3a formed with an opening 4 at least at the back surface Wb of the wafer W and that is decreased in diameter from the one end 3a toward the other end 3b. The opening 4 is formed on the side of the surface on which the pulsed laser beam LB is incident (on the side of the back surface Wb). With the minute holes 3 formed inside the wafer W, at the time when the dividing step to be described later is conducted, it is ensured, by only exerting a comparatively small external force from the other end 3b side, that the minute holes 3 are more easily expanded on the diametrically increased one end 3a side than on the other end 3b side, and, accordingly, the wafer W can be divided in a favorable manner.

In the periphery of the minute hole 3, a modified region 5 modified into an amorphous state is formed surrounding the minute hole 3. The formation of the minute hole 3 by application of the laser beam LB is intermittently conducted along the street S, to form the plurality of minute holes 3. Cracks are formed partly between the adjacent minute holes 3. Then, when the pluralities of minute holes 3 and modified regions 5 have been formed along all the streets S depicted in FIG. 1, the laser processing step is completed. The minute holes 3 are, for example, 1 µm in diameter, and, in the first embodiment, the processing feed rate of the wafer W is set to 500 mm/second and the repetition frequency of the pulsed laser beam LB is set to 50 kHz, whereby the minute holes 3 are formed at a pitch of 10 µm along the streets S.

(2) Checking Step

At least before performing the dividing step, it is checked at which of the front surface Wa and the back surface Wb of the wafer W the one end 3a (opening 4) or the other end 3b (the opening smaller than at the one end 3a) of the minute hole 3 is formed. As a method for the checking, for example, the front surface Wa and the back surface Wb of the wafer W may be observed using a microscope which is not illustrated. When the size of the minute hole 3 on the front surface Wa side of the wafer W and the size of the minute hole 3 on the back surface Wb side are compared with each other, in the first embodiment, it can be confirmed that the one end 3a of the minute hole 3 is formed at the back surface Wb of the wafer W and the other end 3b of the minute hole 3 is formed at the front surface Wa of the wafer W. In the case where the one end 3a and the other end 3b of the minute hole 3 cannot be confirmed even upon observation of the front and back surfaces Wa and Wb of the wafer W, a process may be performed in which, for example, before the dividing step, either an unrequired region of the wafer W or a dummy work of the same material as the wafer W is cut by a cutting blade to cut the front and back surfaces Wa and Wb of the wafer W completely, and the section of the wafer W is observed, to thereby check at which of the front surface Wa and the back surface Wb of the wafer W the one end 3a or the other end 3b of the minute hole 3 is formed. Note that in the first embodiment, the minute holes 3 and the modified regions 5 are clearly illustrated by schematically depicting them in FIG. 4 and in FIG. 5 to be described later, for convenience of explanation, but the minute holes 3 and the modified regions 5 formed by actual processing are not clear but obscure. Even when they are thus obscure, it is possible, by observing at least the front and back surface sides of the wafer W, to determine at which of the front surface Wa and the back surface Wb of the wafer W the one end 3a (opening 4) or the other end 3b (the opening smaller than at the one end 3a) of the minute hole 3 is formed.

(3) Dividing Step

Figure 5:
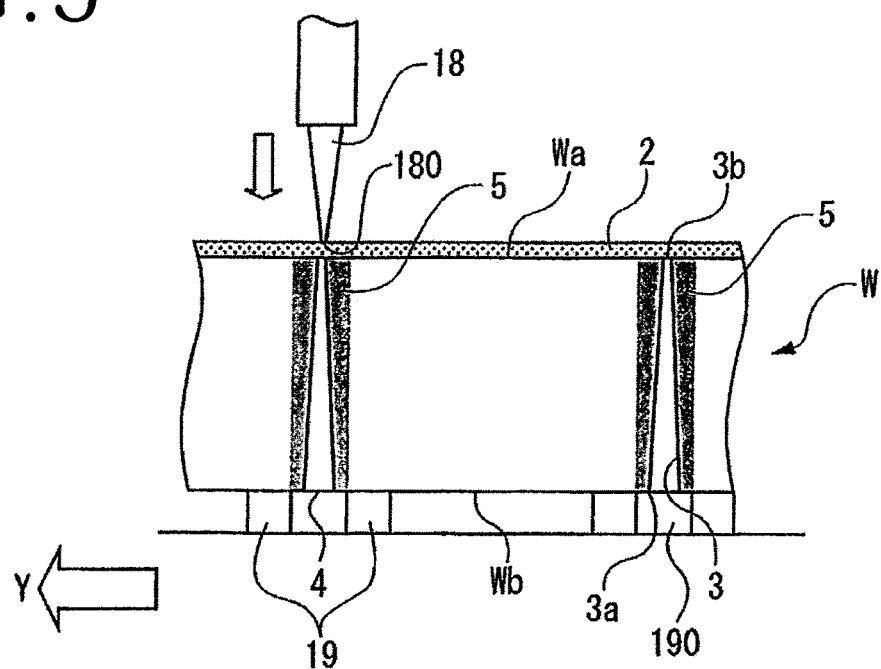
FIG. 5 is a sectional view depicting a first embodiment of a dividing step.

As depicted in FIG. 5, the wafer W is inverted front side back, the one end 3a side of the minute hole 3 of the wafer W, or the side on which the opening 4 is formed, is supported by support members 19, for example, and the wafer W is divided along the streets S by a pressing member 18 disposed on the upper side of the support members 19. The support members 19 have gaps 190, and can support the wafer W through the adhesive tape 2. The pressing member 18 is, for example, a breaking blade, its tip portion 180 is formed rectilinearly along the straight line of the street S depicted in FIG. 1, and can exert an external force on the inside of the wafer W. The pressing member 18 can be moved in the vertical direction by a lift mechanism which is not illustrated.

For alignment between the street S of the wafer W and the pressing member 18, the street S is detected by an alignment camera which is not depicted. Subsequently, the wafer W is mounted on the support members 19, with the back surface Wb side of the wafer W directed to the lower side. In this instance, a single street S is moved to the inside of the gap 190 between the support members 19, whereby the openings 4 of the minute holes 3 formed along a single street S are positioned on the upper side of the gap 190.

In addition, in the dividing step, the pressing member 18 is positioned in relation to that surface of the front surface Wa and the back surface Wb of the wafer W at which the one end 3a of the minute hole 3 is not opening (that surface on which the other end 3b is formed). In the first embodiment, the tip portion 180 of the pressing member 18 is positioned at a position which is over the front surface Wa of the wafer W and which is directly above the street S. Next, the pressing member 18 is lowered in the direction for approaching the wafer W, and the front surface Wa of the wafer W is pressed downward by a predetermined depth by the tip portion 180 through the adhesive tape 2, thereby exerting an external force (bending stress). The predetermined depth is set, for example, to 20 μm from the height position of the upper surface of the wafer W. As a result of such pressing of the wafer W, the minute hole 3 is pushed wide open from the diametrically reduced other end 3b side toward the diametrically enlarged one end 3a side, the portion located on the upper side of the gap 190 is pressed downward, and the wafer W becoming unable to endure the external force is divided.

After the wafer W is divided along one street S, the wafer W is subjected to index feeding in the direction of arrow Y, for example, to move the adjacent street S to the inside of the gap 190 between the support members 19 and thereby to align the tip portion 180 of the pressing member 18 to a position where it can make contact with the street S, after which the wafer W is pressed downward from the front surface Wa side by the pressing member 18 along the adjacent street S, thereby exerting an external force, in the similar manner to above. In this way, the wafer W is divided along all the streets S by the pressing member 18 into individual chips, whereon the dividing step is completed.

Thus, in the first embodiment of the dividing method according to the present invention, at the time of performing the dividing step after the laser processing step is conducted to form along the streets S the minute holes 3 extending in the application direction of the pulsed laser beam LB, that surface of the front and back surfaces Wa and Wb of the wafer W at which the diametrically reduced other end 3b of the minute hole 3 is formed (for example, the front surface Wa) is pressed by the pressing member 18. Therefore, the side of the one end 3a diametrically enlarged as compared to the other end 3b is easily pushed wide open, so that the dividability of the wafer W is enhanced as compared to the case where the one end 3a side is pressed, and, accordingly, the wafer W can be favorably divided without being damaged or broken. In addition, in the present invention, at least before conducting the dividing step, the checking step is conducted to check at which of the front surface Wa and the back surface Wb of the wafer W the one end 3a or the other end 3b of the minute hole 3 is formed. Therefore, proceeding to the dividing step can be made after grasping the one end 3a of the minute hole 3 on which the external force is to be exerted by the pressing member 18 at the time of the diving step, and, accordingly, the wafer W can be divided reliably.

2. Second Embodiment of Dividing Method

Figure 7:
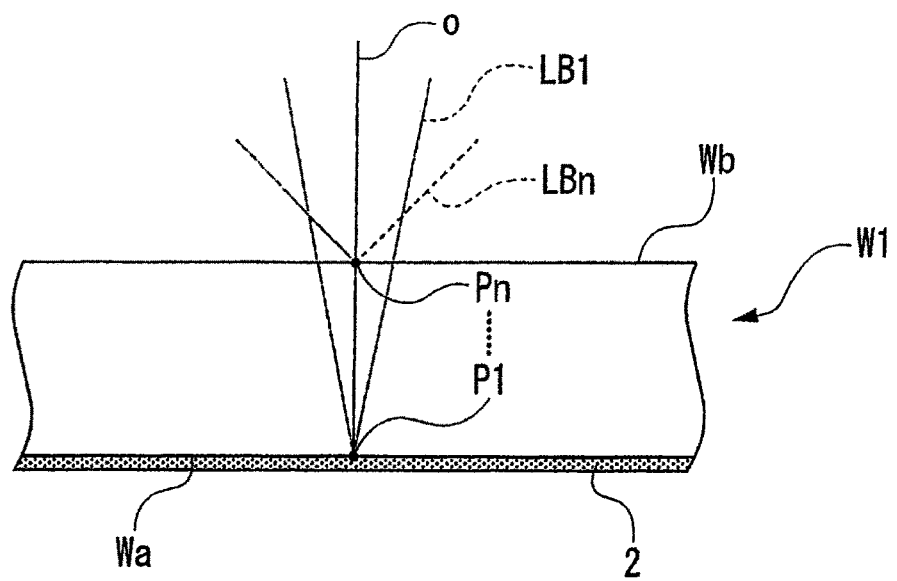
FIG. 7 is a partial enlarged sectional view for explaining a focal point position of a pulsed laser beam in the second embodiment.
Figure 8:
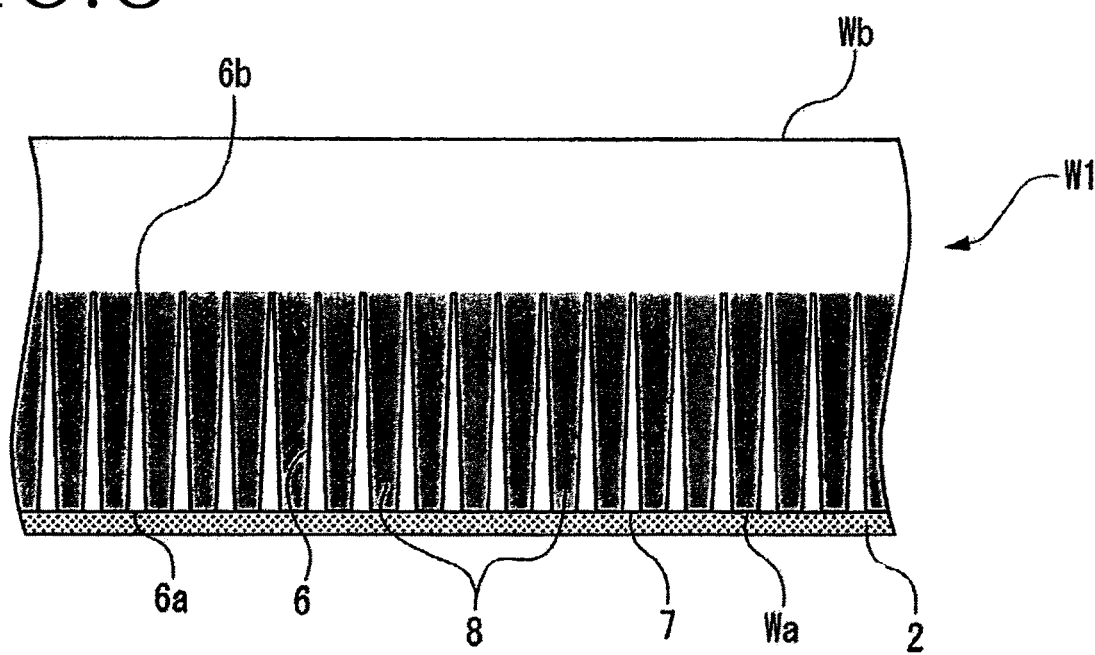
FIG. 8 is a partial enlarged sectional view depicting the state of a wafer after the second embodiment of the laser processing step is conducted.

A second embodiment of the dividing method for dividing a wafer W1 into individual chips will be described below, referring to FIGS. 6 to 8.

(1) Laser Processing Step

Figure 6:
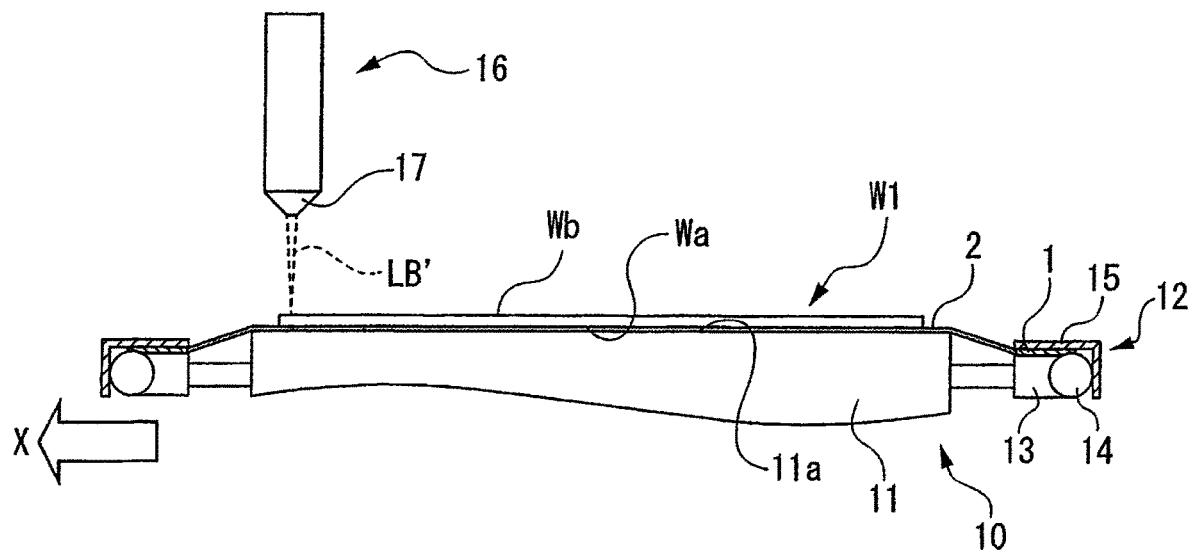
FIG. 6 is a sectional view depicting a second embodiment of the laser processing step.

As depicted in FIG. 6, in the similar manner to in the first embodiment, the front surface Wa side of the wafer W1 with the adhesive tape 2 adhered thereto is mounted on the holding surface 11a of the holding table 11, and the frame 1 is placed on the frame mount base 13. The clamp sections 15 are rotated around the shaft sections 14, to press and fix the upper surface of the frame 1. A laser processing step in the second embodiment is carried out, for example, under the following processing conditions 2. The wafer W1 is configured in the similar manner to the above-mentioned wafer W except for the material, and, therefore, the same reference symbols as above are used.

[Processing Conditions 2]
Material of wafer: SiC (silicon carbide)
Wavelength: 530 nm
Average output: 3 W Repetition frequency: 50 kHz
Pulse width: 10 ps
Spot diameter: 10 μm
Processing feed rate: 500 mm/second
(Numerical aperture of focusing lens)/(Refractive index of wafer): 0.05 to 0.20

The laser beam applying unit 16 lowers the condenser 17 in the direction for approaching the wafer W1, and positions the position of the focal point of a laser beam LB' in such a manner as to extend in the thickness direction of the wafer W1. For example, as depicted in FIG. 7, the position of a focal point P1 of a pulsed laser beam LB1 passing on an optical axis O located on the innermost side of the condenser 17 is positioned on the holding table 11 side (the front surface Wa side of the wafer W1) depicted in FIG. 6, and the position of a focal point Pn of a pulsed laser beam LBn passing on the outermost side of the condenser 17 is positioned on the back surface Wb side of the wafer W1. As a result, the focal points of the pulsed laser beam LB' passing through the focusing lens of the condenser 17 are positioned in such a manner as to extend ranging from the back surface Wb to the front surface Wa of the wafer W1. Next, while subjecting the wafer W1 to processing feeding at a predetermined processing feed rate (500 mm/second) in the direction of arrow X, for example, the laser beam applying unit 16 applies the pulsed laser beam LB' of the predetermined wavelength (530 nm) along the street S depicted in FIG. 1 from the back surface Wb side of the wafer W1, to form a plurality of minute holes 6, that extend in the application direction of the pulsed laser beam LB' and are depicted in FIG. 8, along the street S.

Each of the minute holes 6 is a minute hole that has one end 3a formed with an opening 7 at least at the front surface Wa of the wafer W1 and that is decreased in diameter from the one end 6a to the other end 6b thereof, and it is formed in the reverse direction to the minute hole 3 in the first embodiment. Specifically, the opening 7 is formed on the side (the front surface Wa side) opposite to the surface on which the pulsed laser beam LB' is incident, and the other end 6b of the minute hole 6 is formed in the inside of the wafer W1 on the back surface Wb side. Since the pulsed laser beam LB1 depicted in FIG. 7 that passes on the center side of the focusing lens is higher in power, or higher in processing performance, than the pulsed laser beam LBn, the opening 7 is formed on the side of the focal point P1 of the pulsed laser beam LB1 in the second embodiment. With the minute holes 6 formed in the inside of the wafer W1, at the time when the dividing step to be described later is conducted, it is possible that, by only exerting a comparatively small external force from the other end 6b side, the minute hole 6 is pushed wide open more easily on the diametrically enlarged one end 6a side than on the other end 6b side of the minute hole 6, and, accordingly, the wafer W1 can be divided favorably. In the periphery of the minute hole 6, a modified region 8 modified into an amorphous state is formed surrounding the minute hole 6. Cracks are formed partly between the adjacent minute holes 6. When the pluralities of minute holes 6 and modified regions 8 have been formed along all the streets S, the laser processing step is completed. The minute hole 6 is, for example, 1 μm in diameter, and, in the second embodiment, also, the processing feed rate of the wafer W1 is set to 500 mm/second and the repetition frequency of the pulsed laser beam LB' is set to 50 kHz, whereby the minute holes 6 are formed at a pitch of 10 μm along the streets S.

(2) Checking Step

At least before conducting the dividing step, it is checked at which of the front surface Wa and the back surface Wb of the wafer W1 the one end 6a (opening 7) or the other end 6b (the opening smaller than at the one end 6a) of the minute hole 6 is formed. In the second embodiment, it can be confirmed that the opening 7, or the one end 6a of the minute hole 6, is formed at the front surface Wa of the wafer W1, and the other end 6b of the minute hole 6 is formed on the back surface Wb side of the wafer W1. The method for checking is similar to in the first embodiment. Note that in the second embodiment, also, the minute holes 6 and the modified regions 8 are schematically depicted clearly in FIG. 8 and in FIG. 9 to be described later, for convenience of explanation, but the minute holes 6 and the modified regions 8 formed by actual processing are not clear but obscure.

(3) Dividing Step

Figure 9:
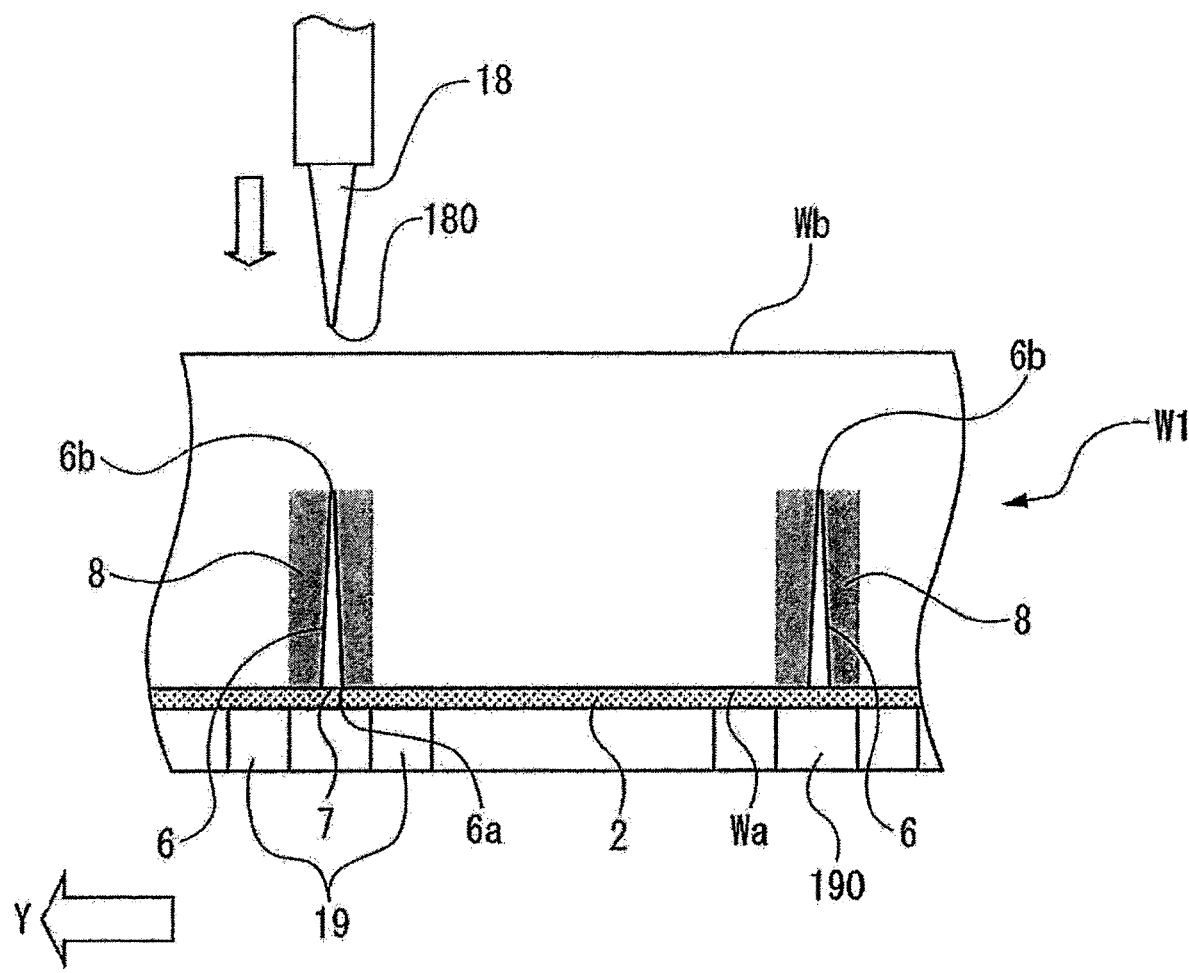
FIG. 9 is a sectional view depicting a second embodiment of the dividing step.

As depicted in FIG. 9, the one end 6a side of the minute hole 6, or the side where the opening 7 is formed, of the wafer W1 is supported by the support members 19, for example, and the wafer W1 is divided along the street S by the pressing member 18 disposed on the upper side of the support members 19. In the similar manner to in the first embodiment, the street S is detected by the alignment camera which is not illustrated. Subsequently, the wafer W1 is mounted on the support members 19, with the adhesive tape 2 side directed to the lower side. In this instance, one street S is moved to the inside of the gap 190 between the support members 19, whereby the openings 7 of the minute holes 6 formed along the one street S are positioned on the upper side of the gap 190.

Besides, in the second embodiment, also, the pressing member 18 is positioned in relation to that surface of the front surface Wa and the back surface Wb of the wafer W1 at which the one end 6a of the minute hole 6 is not opening (that surface on the side where the other end 6b is formed). In the second embodiment, the tip portion 180 of the pressing member 18 is positioned at the position which is over the back surface Wb of the wafer W1 and which is directly above the street S. The pressing member 18 is lowered in the direction for approaching the wafer W1, and the back surface Wb of the wafer W1 is pressed downward by a predetermined depth by the tip portion 180, thereby exerting an external force (bending stress). The predetermined depth is set to 20 μm from the height position of the upper surface of the wafer W1. With the wafer W1 pressed in this way, the minute hole 6 is pushed wide open from the diametrically reduced other end 6b side toward the diametrically enlarged one end 6a side, the portion located on the upper side of the gap 190 is pressed downward, and the wafer W1 becoming unable to endure the external force is divided. Note that while the back surface Wb of the wafer W1 is pressed directly by the pressing member 18 in the present embodiment, the back surface Wb may be pressed through an adhesive tape or the like.

After divided along one street S, the wafer W1 is subjected to indexing feeding in the direction of arrow Y, for example, to move the adjacent street S to the inside of the gap 190 between the support members 19 and thereby to align the tip portion 180 of the pressing member 18 to a position where it can make contact with the street S, whereon the wafer W1 is pressed downward from the back surface Wb side along the adjacent street S by the pressing member 18 in the similar manner to above, thereby exerting an external force. When the wafer W1 has been divided along all the streets S by the pressing member 18 into individual chips, the dividing step is completed. Thus, in the second embodiment of the dividing method according to the present invention, also, at the time of conducting the dividing step, that surface of the front and back surfaces Wa and Wb of the wafer W1 at which the diametrically reduced other end 6b of the minute hole 6 is formed (for example, the back surface Wb) is pressed by the pressing member 18; therefore, the minute hole 6 is pushed wide open more easily on the diametrically enlarged one end 6a side than on the other end 6b side, so that the dividability of the wafer W1 is enhanced, as compared to the case of pressing the one end 6a side, and, accordingly, the wafer W1 can be divided favorably, without being damaged or broken.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece dividing method for dividing a workpiece along streets set on the workpiece, comprising:
    a laser processing step of applying a pulsed laser beam to the workpiece along the street to form along the street a plurality of minute holes extending in a pulsed laser beam application direction, wherein each of the plurality of minute holes has a first end with an opening at least at one of a front surface and a back surface of the workpiece and is decreased in diameter from the first end toward an opposing, second end;
    an aligning step of aligning the opening between two support members; and
    a dividing step of pressing the streets by a pressing member to divide the workpiece along the streets, after the laser processing step is conducted,
    wherein
    in the dividing step, the pressing member is pressed against that surface of the front surface and the back surface of the workpiece at which the minute hole is not open.

2. The workpiece dividing method according to claim 1, further comprising:
    a checking step of checking at which one of the front surface and the back surface of the workpiece the first end or the second end of the minute hole is formed, before carrying out the dividing step.

3. The workpiece dividing method according to claim 2, wherein the checking step includes checking at which one of the front surface and the back surface of the workpiece the first end or the second end of the minute hole is formed using a microscope.

4. The workpiece dividing method according to claim 1, wherein the aligning step includes detecting the alignment of the opening between the two support members using an alignment camera.

5. The workpiece dividing method according to claim 1, further comprising positioning focal points of the pulsed laser beam to extend from the back surface to the front surface of the workpiece.

6. The workpiece dividing method according to claim 1, wherein the laser processing step includes forming modified regions along the plurality of minute holes.

7. A workpiece dividing method for dividing a workpiece along streets set on the workpiece, comprising:
    a laser processing step of applying a pulsed laser beam to the workpiece along the street to form along the street a plurality of minute holes extending in a pulsed laser beam application direction, wherein each of the plurality of minute holes has a first end with a first opening at a front surface of the workpiece and a second, opposing end with a second opening at a back surface of the workpiece, wherein each of the plurality of holes decreases in diameter from the second end toward the first end; and
    a dividing step of pressing the streets by a pressing member to divide the workpiece along the streets, after the laser processing step is conducted, wherein in the dividing step, the pressing member is pressed against the front surface of the workpiece at the first opening at the first end of each of the plurality of minute holes.

8. The workpiece dividing method according to claim 7, further comprising:
    a checking step of checking the front surface and the back surface of the workpiece for the first opening at the first end and the second opening at the second end of each of the plurality of the minute holes formed in the workpiece, before carrying out the dividing step.

9. The workpiece dividing method according to claim 8, wherein the checking step includes checking the front surface and the back surface of the workpiece for the first opening at the first end and the second opening at the second end of each of the plurality of the minute holes formed in the workpiece, using a microscope.

10. The workpiece dividing method according to claim 7, further comprising positioning focal points of the pulsed laser beam to extend from the back surface to the front surface of the workpiece.

11. The workpiece dividing method according to claim 7, wherein the laser processing step includes forming modified regions along the plurality of minute holes.

12. A workpiece dividing method for dividing a workpiece along streets set on the workpiece, comprising:
    a step of setting a position of a focal point of a pulsed laser beam relative to the workpiece by setting a value A for a laser applying unit in the range of from 0.05 to 0.20, where A is obtained by dividing numerical aperture of a focusing lens by refractive index of the workpiece;
    a laser processing step of applying the pulsed laser beam through the focusing lens to the workpiece based on the value of A, along the street to form, along the street, a plurality of minute holes extending in a pulsed laser beam application direction, wherein each of the plurality of minute holes has a first end with an opening at least at one of a front surface and a back surface of the workpiece and is decreased in diameter from the first end toward an opposing, second end; and
    a dividing step of pressing the streets by a pressing member to divide the workpiece along the streets, after the laser processing step is conducted,
    wherein in the dividing step, the pressing member is pressed against that surface of the front surface and the back surface of the workpiece at which the minute hole is not open.

* * * * *